United States Patent [19]

Kim et al.

[11] Patent Number: 5,372,950
[45] Date of Patent: Dec. 13, 1994

[54] METHOD FOR FORMING ISOLATION REGIONS IN A SEMICONDUCTOR MEMORY DEVICE

[75] Inventors: Yun-gi Kim, Weonju; Cheon-su Bhan, Seoul; Byeong-yeol Kim, Suwon, all of Rep. of Korea

[73] Assignee: Samsung Electronics Co., Ltd., Kyunggi-do, Rep. of Korea

[21] Appl. No.: 845,705

[22] Filed: Mar. 4, 1992

[30] Foreign Application Priority Data

May 18, 1991 [KR] Rep. of Korea .................. 91-8121

[51] Int. Cl.⁵ ............................................ H01L 21/76
[52] U.S. Cl. ...................................... 437/24; 437/72; 437/35
[58] Field of Search ............... 148/DIG. 85, DIG. 86; 437/24, 35, 72

[56] References Cited

U.S. PATENT DOCUMENTS

| | | | |
|---|---|---|---|
| 4,918,027 | 4/1990 | Fuse et al. | 437/35 |
| 4,923,563 | 5/1990 | Lee | 437/72 |
| 5,047,359 | 9/1991 | Nagatomo | 437/35 |
| 5,229,318 | 7/1993 | Straboni et al. | 437/72 |

FOREIGN PATENT DOCUMENTS

| | | |
|---|---|---|
| 63-72114 | 4/1988 | Japan . |
| 63-300518 | 12/1988 | Japan . |
| 1245519 | 9/1989 | Japan . |
| 2267952 | 11/1990 | Japan . |
| 340431 | 2/1991 | Japan . |
| 2185624 | 7/1987 | United Kingdom . |

*Primary Examiner*—George Fourson
*Attorney, Agent, or Firm*—Cushman, Darby & Cushman

[57] ABSTRACT

A method for forming an isolation region within a semiconductor device is disclosed. A trench is first formed in a predefined isolation region of a semiconductor substrate. An oxidation blocking material is injected into the inside walls of the trench before growing a field oxide film inside the trench. Accordingly, the present invention can simplify the fabrication of isolation regions within a semiconductor device by directly implanting the oxidation blocking material at a predetermined angle into the inside walls of the trench which constitutes the isolation region. In the present invention, unlike conventional fabrication processes using spacers to prevent penetration of a field oxide film into the surface of semiconductor non-isolation regions, the need for spacers is obviated.

6 Claims, 2 Drawing Sheets

METHOD FOR FORMING ISOLATION REGIONS IN A SEMICONDUCTOR MEMORY DEVICE

BACKGROUND OF THE INVENTION

1. Field of the Invention

The present invention relates to an isolation region fabrication process in a semiconductor device. More particularly, the present invention relates to a fabrication process in a semiconductor memory device for simplifying the process for forming an isolation region.

2. Description of the Related Art

In recent years, as research and fabrication techniques of semiconductor devices continues and the fields of application of memory devices expands, memory devices having large storage capacities are being developed. A need for memory cell miniaturization has promoted the development of high density memory devices at an increasingly rapid rate. Semiconductor design strategies to double integration of on-chip memory components continues to expand with each new generation.

A particularly significant factor in the recent achievements towards miniaturization and high integration of memory devices is a reduction of the isolation region separating adjoining memory cells, Several isolation techniques are particularly well-known including: LOCOS (LOCal Oxidation of Silicon), a method for selectively growing a thick oxide film on a semiconductor substrate and using it as the isolation region; SWAMI (Side Wall Masked Isolation), a method for preventing the extension of an oxide film from an isolation region to a device-forming region during field oxidation, by etching a semiconductor substrate in the isolation region to form either a nitride film or mask on previously etched side walls; SEPOX (SElective Polysilicon OXidation), a method for oxidizing polycrystalline silicon film and using it as the isolation region; and BOX (Buried Oxide Isolation), a method for burying an insulating material by first forming a groove.

FIGS. 1A to 1F are a step-by-step illustration of a process for forming an isolation region based on the conventional SWAMI technique discussed above.

FIG. 1A shows an isolation region which is first formed with opening OP, first oxide film OX1, also known as buffer oxide film, and first nitride film N1 sequentially deposited on first conductive type semiconductor substrate 100. Semiconductor substrate 100 is then exposed by removing portions of first nitride film N1 and first oxide film OX1 corresponding to an isolation region. This is accomplished by a dry etching process. The thin opening OP having inclined side surfaces is subsequently formed as shown in FIG. 1A. The inclined side surfaces are formed by wet etching exposed semiconductor substrate 100.

As shown in FIG. 1B, second oxide film OX2 is then formed, serving as a buffer. Second nitride film N2 and third oxide film OX3 serve as spacers and are deposited sequentially over the resultant structure.

FIG. 1C shows spacers subsequently formed by isotropically etching the second oxide film OX2 and the third oxide film OX3 and the second nitride film N2 using a dry etching process. A channel-stop layer 13 is then formed by ion-implanting a first conductive type impurity, such as boron, to prevent field inversion.

In FIG. 1D, the spacer portion of third oxide film OX3 is removed using a wet etching process.

In FIG. 1E, field oxide film 14 is then formed by oxidizing exposed semiconductor substrate 100.

Finally, as shown in FIG. 1F, the isolation process is completed by removing the first nitride film N1 and the second nitride film N2 and the first oxide film OX1.

The above described isolation method based on the conventional SWAMI technique etches the semiconductor substrate corresponding to the isolation region to form spaces along previously etched side walls. This conventional technique works well to reduce the size of the so-called bird's beak. A large bird's beak is a problem commonly associated with the LOCOS semiconductor fabrication technique discussed above.

The spacer forming step of the SWAMI fabrication process, however, is unfavorably complex. Furthermore, because spacers are formed before field oxide film 14 is grown, the surface of the field oxide film 14 is severely uneven, particularly closer to the boundaries between the isolation region and the device-forming region (see FIG. 1F). This unevenness further complicates and adversely affects subsequent surface layering and etching of the semiconductor memory fabrication process.

SUMMARY OF THE INVENTION

It is an object of the present invention to provide an isolation method of a semiconductor device which can reduce the size of a bird's beak without the formation of a spacer.

To achieve the object of the present invention, a trench is first formed in an isolation region of the semiconductor substrate. A field oxide film is then grown inside the trench by first implanting an oxidation blocking material into the inside walls of the trench.

BRIEF DESCRIPTION OF THE DRAWINGS

The above object and other advantages of the present invention will become more apparent by describing the preferred embodiment of the present invention with reference to the attached drawings, in which.

DETAILED DESCRIPTION OF THE PREFERRED EMBODIMENTS

Hereinafter, the present invention will be described with reference to the accompanying drawings.

FIGS. 2A through 2E sequentially show an embodiment of the process for forming an isolation region according to the present invention.

Figure 1A:
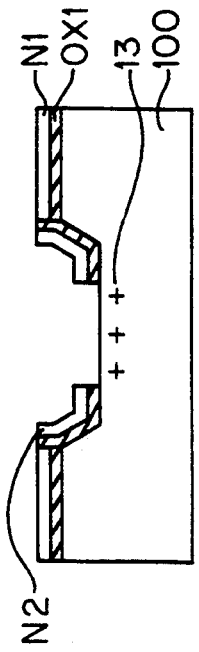
FIGS. 1A through 1F illustrate a fabrication process of an isolation region in a semiconductor device based on the conventional SWAMI technique.
Figure 1B:
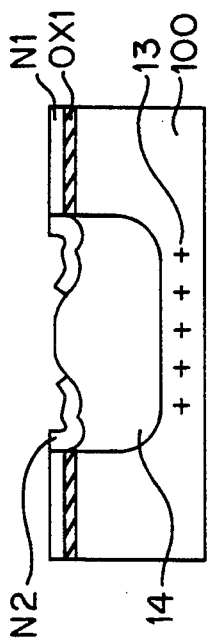
Figure 1C:
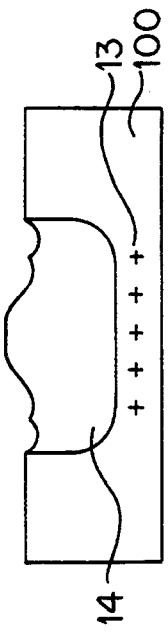
Figure 1D:
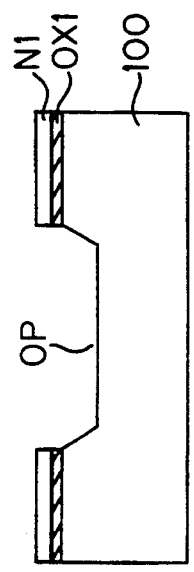
Figure 1E:
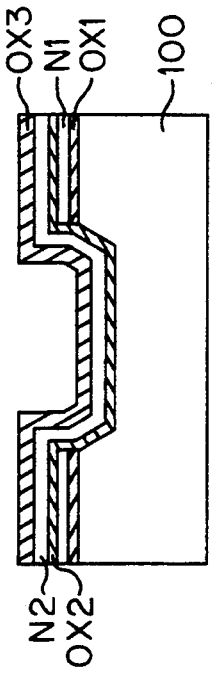
Figure 1F:
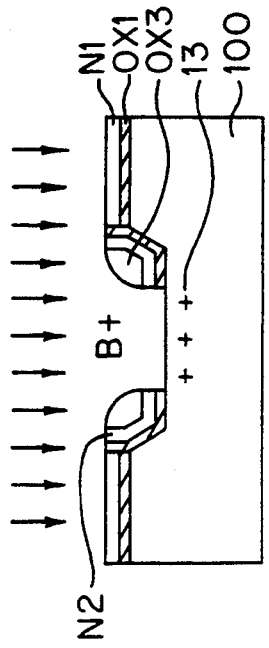
Figure 2A:
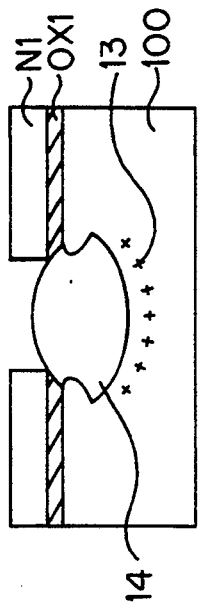
FIGS. 2A through 2E illustrate a fabrication process of an isolation region according to the present invention.

FIG. 2A illustrates a first semiconductor substrate 100, an oxide film OX1, and a first nitride film N1. This is achieved by thermally growing a first oxide film OX1 (also known as buffer oxide film) to a thickness of 240 Å, on a first conductive layer, such as a p-type semiconductor substrate 100. A nitride film N1 having a thickness of 1,500 Å is then formed on the first oxide film OX1 by a LPCVD (Low-Pressure Chemical Vapor Deposition) method.

Figure 2B:
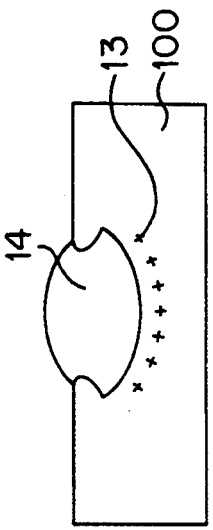

As shown in FIG. 2B, a trench 10 and an oxide film 11 are then formed. A photoresist is coated on the first nitride film N1, and its surface is then exposed using a mask having a pattern size of approximately 0.4 μm and then developed to obtain a photoresist pattern defining the active regions and the isolation regions of the semiconductor substrate. The trench 10 is formed by dry-etching the first nitride film N1 and first oxide film OX1 at a position corresponding to the isolation region. The position is defined by the photoresist pattern to expose the semiconductor substrate. The uncovered region is successively dry-etched to a predetermined depth, e.g., 0.15 μm. To compensate for the damage of the substrate's surface along the trench resulting from the formation of the trench 10, the oxide film 11 is formed to a thickness of 200 Å on the inner surfaces of the trench 10 by a process of thermal oxidation. When the field oxide film 11 is formed inside the trench, an oxidation blocking material 12 such as nitrogen ion is ion-implanted with a dosage of $1 \times 10^{16}$ ions/cm$^2$ or greater, at a slope of 45°, into the inside walls of the trench to prevent formation of a penetrating oxide film out along the semiconductor memory device forming region (corresponding to the bird's beak in the LOCOS technique). The angle of the inclined ion-implantation can vary from 10° to 60° in accordance with the size of the trench.

Figure 2C:
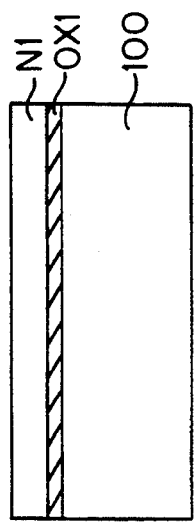

In FIG. 2C a channel-stop layer 13 is formed by removing the photoresist pattern of FIG. 2B and ion-implanting a first conductive type impurity to prevent field inversion. This impurity could be boron material having a dosage of $1 \times 10^{13}$ ions/cm$^2$ at an energy level of 30 KeV.

Figure 2D:
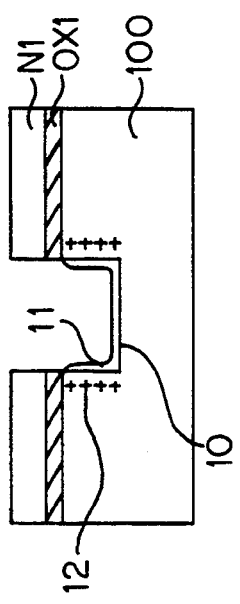

In FIG. 2D, a field oxide film 14 is formed by thermally oxidizing the semiconductor substrate inside the trench of FIG. 2C to a thickness of 4,500 Å. Because the implanted nitrogen ions block the growth of the oxide film, the sides of the field oxide will have dents as shown in FIG. 2D.

Figure 2E:
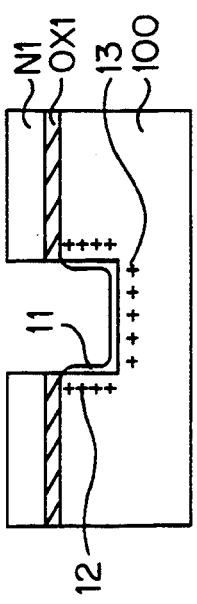

FIG. 2E illustrates the completion of the isolation region fabrication process by sequentially removing the first nitride layer N1 and the first oxide layer OX1 of FIG. 2D using a conventional wet-etching process.

An n-type semiconductor substrate may be substituted in the embodiment of the present invention for the p-type semiconductor substrate 100 described above.

The isolation region formed according to the present invention is advantageous in that, unlike conventional spacer-forming techniques, the present process is greatly simplified. Oxidation is blocked simply by the direct implantation of nitrogen ions at a specified angle into the inside walls of a trench. As a result, the need for nitride and oxide film spacers for preventing unfavorable extensions of the field oxide film from the isolation region to the device forming region is obviated.

Moreover, the fabrication process of the present invention does not provide an uneven field oxide film surface and is therefore a much improved method over the more complex spacer-forming methods of the prior art.

Furthermore, the electrically effective isolation distance of an isolation region formed according to the fabrication process of the present invention was determined to be greater than that of an isolation region of equal size formed by any of the well known fabrication processes of the prior art.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method for forming an isolation region within a semiconductor device comprising the steps of:
    forming a trench defining an isolation region in a semiconductor substrate;
    implanting an oxidation blocking material into an inside wall of said trench; and
    growing a field oxide film within said trench.

2. A method for forming an isolation region within a semiconductor device comprising the steps of:
    sequentially forming a first oxide film and a first nitride film on a first conductive type semiconductor substrate;
    applying a photoresist pattern to said first nitride film and then exposing a portion of said semiconductor substrate by sequentially etching said first nitride film and said first oxide film to define a non-isolation region and an isolation region of said semiconductor substrate;
    forming a trench by etching said exposed portion of said semiconductor substrate;
    ion-implanting, at a non-vertical angle, an oxidation blocking material into inside walls of said trench;
    forming a channel-stop layer by implanting a first conductive impurity into a bottom of said trench: and
    growing a field oxide film within said trench.

3. The method of claim 2, wherein said step for forming a trench further includes a step of forming an oxide film on inside surfaces of said trench.

4. The method of claim 2, wherein said oxidation blocking material is a nitride.

5. The method of claim 4, wherein a concentration of said ion-implanted oxidation blocking nitride is $1 \times 10^{16}$ ions/cm$^2$ or greater.

6. The method of claim 2, wherein vertical angle of said ion-implantation process ranges from 10° to 60° from vertical, said slope range varying selectively as a function of a size of said trench.

* * * * *